US008238508B2

(12) United States Patent
Pignol et al.

(10) Patent No.: US 8,238,508 B2
(45) Date of Patent: Aug. 7, 2012

(54) CLOCK EXTRACTION DEVICE WITH DIGITAL PHASE LOCK, REQUIRING NO EXTERNAL CONTROL

(75) Inventors: Michel Pignol, Toulouse (FR); Claude Neveu, Saint Clar de Riviere (FR); Yann Deval, Bordeaux (FR); Jean-Baptiste Begueret, Talence (FR); Olivier Mazouffre, Latresne (FR)

(73) Assignee: Centre National d'Etudes Spatiales (C.N.E.S.), Paris (FR)

( * ) Notice: Subject to any disclaimer, the term of this patent is extended or adjusted under 35 U.S.C. 154(b) by 298 days.

(21) Appl. No.: 12/594,791

(22) PCT Filed: Apr. 4, 2008

(86) PCT No.: PCT/FR2008/000479
§ 371 (c)(1),
(2), (4) Date: Dec. 14, 2009

(87) PCT Pub. No.: WO2008/139064
PCT Pub. Date: Nov. 20, 2008

(65) Prior Publication Data
US 2010/0134158 A1 Jun. 3, 2010

(30) Foreign Application Priority Data
Apr. 6, 2007 (FR) .................................. 07 02552

(51) Int. Cl.
*H03D 3/24* (2006.01)
(52) U.S. Cl. ......................... 375/376; 327/152; 327/291

(58) Field of Classification Search .......... 375/354–355, 375/376; 327/141, 156, 164, 291
See application file for complete search history.

(56) References Cited

U.S. PATENT DOCUMENTS

| 3,609,408 | A | 9/1971 | Motisher et al. |
| 4,059,812 | A | 11/1977 | Procter |
| 5,671,259 | A | 9/1997 | Thomas et al. |
| 5,850,422 | A * | 12/1998 | Chen ............................ 375/371 |
| 6,924,705 | B2 | 8/2005 | Huang |
| 6,952,569 | B2 * | 10/2005 | Damgaard et al. ............ 455/118 |
| 7,205,806 | B2 * | 4/2007 | Chong et al. ................... 327/158 |
| 2006/0062341 | A1 * | 3/2006 | Edmondson et al. ......... 375/376 |
| 2008/0049850 | A1 * | 2/2008 | Sidiropoulos et al. ........ 375/257 |
| 2009/0015340 | A1 * | 1/2009 | Dally et al. ...................... 331/57 |

(Continued)

FOREIGN PATENT DOCUMENTS
FR 2838265 10/2003

OTHER PUBLICATIONS
International Search Report dated Nov. 18, 2008 in PCT application.

(Continued)

*Primary Examiner* — Jean B Corrielus
(74) *Attorney, Agent, or Firm* — Young & Thompson

(57) ABSTRACT

A device for extracting a clock signal from a baseband serial signal, includes an injection-locked oscillator (19), a phase-locked loop (25) including a digital phase detector (26). The oscillator (19) includes a digital input for controlling the value of its natural frequency, and the phase-locked loop (25) includes a counting circuit (30, 35) aggregating the relative values of the digital signal supplied by the digital phase detector (26) and supplying a control signal in digital form for the oscillator (19).

19 Claims, 9 Drawing Sheets

U.S. PATENT DOCUMENTS

2010/0073047 A1* 3/2010 Best et al. .................. 327/156

OTHER PUBLICATIONS

Ng H-T et al: "A Second-Order Semidiital Clock Recovery Circuit Based on Injection Locking" IEEE Journal ofSdlid-State Circuits, IEEE Service Center, Piscataway, NJ, US, vol. 38, No. 12, Dec. 2003, pp. 2101-2110.

Jen S H-M et al: "A Single-Chip Dual-Band Tri-Mode CMOS Transceiver for IEEE 802.11a/b/g Wireless LAN" IEEE Journal of Solid-State Circuits, IEEE Service Center, Piscataway, NJ, US, vol. 39, No. 12, Dec. 2004, pp. 2239-2249.

Alexander J D H: "Clock Recovery From Random Binary Signals" Electronics Letters, IEE Stevenage, GB, vol. 11, No. 22, Oct. 30, 1975, pp. 541-542.

* cited by examiner

CLOCK EXTRACTION DEVICE WITH DIGITAL PHASE LOCK, REQUIRING NO EXTERNAL CONTROL

BACKGROUND OF THE INVENTION

The invention relates to a clock-extraction device, and more particularly a device for clock extraction and for extraction of digital data from a baseband serial signal, known as the received signal, that is representative of digital data and coded with a clock signal exhibiting a clock-bit frequency fsr corresponding at least substantially to a nominal frequency fn.

DESCRIPTION OF RELATED ART

In numerous applications, and in particular in the field of very high frequencies (nominal frequencies fn higher than 500 MHz, capable of being higher than 10 GHz, currently capable of going up to 40 GHz and even of very largely exceeding these values in future) corresponding to very high throughputs (higher than 500 Mbits/s, capable of being higher than 10 Gbits/s, and capable of going up to 40 Gbits/s for SONET OC-768 and SDH STM-256 standards and capable of very largely exceeding these values in future) on a transmission channel (the implementation technology of which may be of any type: electrical, optical, radiofrequency etc.) of a baseband serial link a signal is transmitted incorporating digital data mixed with a clock signal in such a manner as to avoid having to transmit these two types of information on two different channels. This makes it possible to avoid any tricky pairing of the path-lengths of the signals. With such signals, at the receiver level it is necessary to extract from the received signal, which is of analogue nature, on the one hand the values of the digital data and, on the other hand, the clock signal corresponding to these data. In order to obtain the values of the data, the received signal is sampled from the clock signal previously extracted from the data.

The most common solution in order to implement such a device for clock extraction and for extraction of data consists in using circuits including at least one phase-locked loop, known as PLL, which principally includes, at the output of a circuit generating pulses corresponding to the rising and falling edges of the received signal, a phase comparator supplying a set-point signal to a voltage-controlled oscillator, known as VCO, via a loop filter. The VCO provides an internal clock signal to a decision flip-flop constituting a sampling circuit which extracts the data from the received signal. These traditional PLL circuits, which use relaxation oscillators or LC mains oscillators, phase/frequency comparators and high-frequency digital dividers, exhibit various drawbacks. They are incompatible with connections having very high throughput; they require an external frequency reference; they require a synchronisation on start-up by a data preamble necessarily having to be present in the received signal, which is not admissible in certain applications; they exhibit great complexity for optimisation of operation and of implementation, numerous interdependent and contradictory parameters having to be taken into account, particularly so far as the phase/frequency comparator circuit is concerned; they have a very significant energy consumption; their analogue implementation is highly dependent on the technology for manufacture of the semiconductor components that is put into effect etc. Consequently, the implementation of a PLL circuit in order to implement a clock-extraction functionality requires the intervention of specialists in analogue circuits having considerable experience and considerable know-how, and, on the other hand, requires significant periods of development, to be repeated regularly with each evolution of technology, something which is not admissible from the point of view of the current constraints of utilisation on an industrial scale.

Another known solution in order to implement the clock extraction is based on the use of a delay-locked loop, known as DLL. These circuits, however, require a specific code so far as the received signal is concerned, in particular with a start-bit and a stop-bit in order to form a reference transition in each word (which reduces the maximal transmission frequency accessible for the data, typically 33% with useful data on 8 bits and a code such as 8B/12B). In addition, the recovered data exhibit a relatively significant phase drift (jitter), capable of resulting in a non-negligible bit-error rate. Also, such a DLL circuit is highly sensitive to noise in the received signal. Lastly, this technique which is put into effect by digital components is not easily compatible with extremely high transmission speeds.

FR 2 838 265 has proposed a solution consisting in using an injection oscillator—that is to say, an oscillator that is injection-locked onto the frequency of edges of the received signal in an open-loop circuit. In order to do this, the injection oscillator is an oscillator with negative resistances using a coupled pair of MOS transistors, and receives a synchronisation-pulse signal that is clocked at the clock-bit frequency fsr of the received signal, this pulse signal being emitted by a generator of synchronisation pulses. This injection-locked oscillator exhibiting a frequency of free oscillations fos has the property of being locked onto the signal of pulses if the frequency of said signal is within its operating range, known as the lock-in range. It then provides a clock signal, the frequency of which corresponds exactly to the clock-bit frequency fsr.

Nevertheless, the problem which is then posed is to ensure also the phase synchronisation of the clock signal provided by the oscillator in relation to the received signal. In this connection it is known that the phase shift introduced by the oscillator is proportional to the difference between the frequency of the signal at the input of the oscillator and the natural frequency fos of said oscillator. Consequently, it is possible to consider adjusting the value of the natural frequency of the oscillator as a function of the clock-bit frequency fsr of the received signal when designing the circuit. But this solution remains imperfect, insofar as the value of this clock-bit frequency fsr is simply not known with precision (which constitutes the principal initial technical problem requiring the presence of a clock-extraction circuit in the receiver). In addition, it would in any case require an adjustment of the circuit for each application. If such an adjustment is admissible within the context of a laboratory prototype, it is not acceptable in the majority of industrial applications of such a circuit.

FR 2 838 265 has proposed solving this problem of phase shift by providing a decision logic in order to select one value from various values provided by a plurality of sampling flip-flops shifted in accordance with distinct shift durations in relation to the pulses of the reception clock signal. It turns out that, in practice, this solution is not really effective in all situations.

Likewise, U.S. Pat. No. 6,924,705 describes a PLL circuit including a digital phase detector, a charge pump and a loop filter controlling a voltage-controlled oscillator, this latter receiving the input data signal via a frequency doubler. Apart from the practical implementation of the digital phase detector not being indicated, this circuit exhibits the drawback of not being able to be implemented entirely in digital form, since the charge pump and the loop filter are components of analogue type. Consequently, the implementation of a circuit according to this document is strictly dependent in practice on the semiconductor technology that is put into effect and cannot be simply and rapidly adapted to another semiconductor technology without requiring a new design of the circuit beforehand. In addition, this circuit which exhibits a low range of admissible input frequencies and which is not automatically adapted to the received signal requires external manual adjustments of the free frequency of the oscillator and of the difference in propagation delays between the various lines, in particular that enabling the data to be extracted and that enabling the clock to be extracted. Consequently, the circuit described in this document cannot be the object of utilisation on an industrial scale in applications where the period of development has to be minimised and/or in those where it is necessary to be able to migrate frequently from one semiconductor technology to another and/or in those where the frequency of the received signal may vary within a wide range of values.

U.S. Pat. No. 5,671,259 describes a clock-recovery circuit including a resonant circuit that is implemented with discrete components mounted on a printed circuit and a digital phase-locked loop including a counting circuit making it possible to format a control signal for adjustment of the frequency of the resonant circuit. The operation of such a resonant circuit is not compatible with an implementation in integrated circuit(s) (the quality factor of the components in this technology being very inadequate) and only enables operating frequencies to be obtained that are not very high (of the order of 2 MHz for the clocking of incoming data). In addition, with such a resonant circuit in the absence of a transition in the data signal the oscillation disappears after a few cycles, so that this type of circuit is not compatible with data signals exhibiting few or no transitions over certain periods. Furthermore, in this document the phase of the input signal may vary over more or less a quarter of a bit—that is to say, an absolute variation of a half bit—without the phase-locked loop reacting, so that the accidental phase shifts between 0% and 50% are not detected. In addition, the counting circuit is a counter over 20 bits, only the 8 most significant bits being used for the control of the resonant circuit. Such an extremely high filtering (a difference of 4096 successive phase shifts being necessary before bringing about an adjustment) is totally ineffective in practice. Above all, contrary to what this document indicates, it does not enable in any manner the possible accidental phase shifts that are present in the input signal to be resolved.

In this way, despite intensive research that has been carried out on these clock-extraction circuits for a long time, the need persists to be able to propose a simple solution that is compatible with utilisation in large numbers on an industrial scale in the majority of the current practical applications of these circuits, including those with connections having very high output—in particular higher than 500 Mbits/s—and/or having very high frequency—in particular higher than 500 MHz—the energy consumption of which is acceptable, and which requires neither external adjustments nor specific design, each manufactured circuit being necessarily regulated on account of its design independently of the production technology that is put into effect, and which remains perfectly in phase with the input data signals while being compatible with a very great variety of such input data signals, including when these latter exhibit periods exhibiting few transitions or without transitions, or numerous accidental phase shifts.

BRIEF SUMMARY OF THE INVENTION

The invention therefore aims to propose such a solution. The inventors have indeed established that it was possible, by means of a specific architecture, to propose for the first time a clock-extraction device, and more particularly a device for clock extraction and for data extraction, that exhibits these qualities, and in particular that is very simple in implementation, 'self-regulated' (that is to say, not requiring any external manual regulation) while exhibiting a wide locking range and a very low bit-error rate while being compatible with a very great variety of input data signals.

The invention also aims to propose such a device that is quite insensitive to variation in quality of the received signals, and in particular that is compatible with signals that are capable of exhibiting a variable density of transitions, and noise.

The invention also aims to propose such a device that can be implemented almost entirely in the form of digital components, and in particular having a phase-locked loop that is integrally implemented in the form of digital components. Indeed, the inventors have ascertained that this results, on the one hand, in a wider range of admissible frequencies for the received signal, and, on the other hand, in a simplicity of implementation of the device, and in particular a possibility of migration from one semiconductor technology to another in simple and rapid manner. The design of each circuit may be effected on the basis of libraries of standard functions without requiring the perfecting of specific components, unlike the former devices (for example, the voltage-controlled gates in a DLL circuit or the analogue components of a PLL circuit).

Throughout the text, the term 'digital component' designates any electronic component exhibiting at least one input terminal and/or output terminal, each terminal conveying a signal, the state of which may vary among a discrete plurality of states, in particular 1 and 0, without the real analogue value of the corresponding signal having an influence on the operation of the component or of the circuit within which it is integrated. Furthermore, throughout the text the terms 'input' and 'output' of a component designate a connecting terminal or a set of connecting terminals receiving or, respectively, supplying a unique signal. The signal applied to an input or supplied by an output may therefore be, apart from complementary precision, just as easily a serial signal as a parallel signal and may be constituted by a single channel or by several channels (particularly in the case of an architecture of differential type).

The invention therefore relates to a device for clock extraction from a baseband serial signal, known as the received signal, that is representative of digital data and coded with a clock signal exhibiting a clock-bit frequency fsr, including:

a circuit receiving a signal resulting from the received signal and clocked at the clock-bit frequency fsr, and supplying, to at least one clock output, a clock signal, known as the reception clock signal, at least substantially synchronised and in phase with the clock-bit frequency fsr of the received signal, a phase-locked loop including:
 a first input connected to a clock output of the circuit supplying a reception clock signal,
 a second input which is fed by a signal resulting from the received signal,
 a digital phase detector including a lead/lag detector connected to the first and second inputs and supplying to at least one output a digital signal, known as the phase-state signal, that is representative of a phase shift between the reception clock signal and the received signal, and of the direction of this shift,
 an output supplying a signal, known as the control signal, which is connected to an input, known as the command input, of the circuit supplying a reception clock signal which is adapted so that the value of the frequency of the reception clock signal depends on the value of the control signal received at this control input, a circuit, known as the counting circuit, exhibiting an input connected to said output of the digital phase detector, said counting circuit being adapted to implement at least one filtering by digital counting/down-counting in respect of the variations of the relative values of the digital signal which are supplied in time by the phase detector, and in order to supply a control signal in digital form, the value of which is a function of the result of this/these filtering(s), this value of the control signal being adapted to set a value of the frequency of the reception clock signal equal to a value, filtered in this way, of the clock-bit frequency fsr of the reception clock signal, characterised in that the circuit supplying a reception clock signal is an injection-locked oscillator with digital control, including a digital control input which is adapted to be able to receive the control signal supplied by the phase-locked loop in digital form, and so that the value of the natural frequency fos of the oscillator depends on the value of the received control signal at this control input, the phase-locked loop includes a circuit exhibiting at least one input connected respectively to the output(s) of the lead/lag detector, and supplying to at least one output a digital signal, known as the filtered phase-state signal:

having a first relative value after reception of a predetermined number N, greater than 1, of successive identical input values, corresponding to N successive data bits of the received signal for which the lead/lag detector has detected a phase shift in the same direction, having a second relative value after reception of N successive identical input values, corresponding to N successive data bits of the received signal for which the lead/lag detector has detected a phase shift in the other direction, having a third relative value in the other cases, so that the relative value of the filtered phase-state signal is representative of the presence of a phase shift in the same direction and of the direction of this phase shift, for N successive data bits of the received signal, between the edges of the reception clock signal and the corresponding data bits of the received signal.

The invention also extends to a device for clock extraction and for extraction of digital data including a clock-extraction device according to the invention. A device for clock extraction and for extraction of digital data according to the invention includes, in addition, a circuit for sampling of the received signal with the reception clock signal, this sampling circuit having a first input, known as the signal input, connected to the reception input, and a second input, known as the clock input, connected to a clock output of the injection-locked oscillator, this sampling circuit being adapted to supply digital data transmitted by the received signal to at least one data output, and is characterised in that it includes at least one phase-shifting circuit which is adapted to introduce a constant phase difference between the signal input and the clock input of the sampling circuit, the total phase difference between these two inputs resulting from each phase-shifting circuit being adapted to guarantee a phase alignment of the signal at the signal input and of the signal at the clock input.

Advantageously and according to the invention, the lead/lag detector is adapted to supply to a first output a digital signal that is representative of the presence of a phase lead between the reception clock signal and the received signal, and to a second output a digital signal that is representative of the presence of a phase lag between the reception clock signal and the received signal.

Advantageously and according to the invention, the lead/lag detector is adapted to sample the received signal at the rising and falling edges of the reception clock signal. More particularly, advantageously and according to the invention the lead/lag detector is adapted to implement a double sampling, one in phase with the edges of the reception clock signal, the other in quadrature with the edges of the reception clock signal, in such a manner as to determine the intermediate state of the received signal.

Furthermore, advantageously and according to the invention a device according to the invention is characterised in that said circuit supplying the filtered phase-state signal is a decision-making converter.

In one embodiment of the invention, N=2. Any other value may nevertheless be chosen, according to the desired level of filtering. Indeed, such a decision-making converter has the effect of implementing a first type of filtering starting from relative values of the phase shifts detected by the digital phase detector. This first filtering makes it possible to liken accidental phase shifts to noise, since only a series of N identical states of the phase shift will have an effect on the output of the decision-making converter. Typically, this first filtering makes it possible to avoid taking account of the phenomena of non-permanent accidental phase drifts such as the phenomena of jitter. In particular, it should be noted that the series of data bits exhibiting a phase shift in the same direction including a number of data bits capable of going as far as N−1 do not modify the value of the filtered phase-state signal.

Furthermore, advantageously and according to the invention said counting circuit includes at least one circuit, known as the accumulator circuit, including at least one input receiving a digital signal resulting from each phase-state signal supplied by the lead/lag detector, this accumulator circuit being adapted to supply a digital signal, known as the counting/down-counting signal, the relative value of which is representative of the reception of a plurality of relative values exhibited at the input(s) of this accumulator circuit.

Advantageously and according to invention, said counting circuit includes successively a decision-making converter and an accumulator circuit that is adapted to aggregate the relative values of the filtered phase-state signal supplied by the decision-making converter.

In a device according to the invention, in combination with the first type of filtering described above, or in a variant, another type of filtering can be implemented by said counting circuit. In this way, advantageously and according to the invention the accumulator circuit exhibits a parallel output and is adapted to supply to this parallel output a parallel digital counting/down-counting signal, and the injection-locked oscillator includes a parallel digital control input comprising a number of bits lower than that of the parallel digital output of the accumulator circuit, only a portion of the high-weight bits of the parallel digital output of the accumulator circuit being linked to the bits of the parallel digital control input of the injection-locked oscillator, so that said control signal supplied by the counting circuit is formed from said portion of high-weight bits of said counting/down-counting signal.

In this way, the value of the control signal is modified only from the moment when the accumulator circuit has counted/down-counted a predetermined threshold number M of data bits having a phase shift in the same direction between the edges of the reception clock signal and the corresponding data bits of the received signal.

In one embodiment according to the invention, the parallel digital output of the accumulator circuit comprises, for example, 8 or 9 bits, and the parallel digital input of the injection-locked oscillator comprises 5 bits, only the 5 high-weight bits of the parallel digital output of the accumulator circuit being linked to the 5 bits of the parallel digital control input of the injection-locked oscillator. In this way, the control signal is modified only from the moment when the accumulator circuit has detected an unbalance of the total (representative of phase shifts in the same direction) at least equal to 111 (binary value) in the relative values that it receives at the input. In this example, in the absence of a decision-making converter it would therefore be the case that M=111.

Said accumulator circuit can be implemented by one or more adders and/or by one or more counters. It should be noted that by virtue of the counting and down-counting function, the M data bits of a series of data bits of identical phase shifts triggering a modification of the control output are not necessarily all successive. For example, they may be, on the contrary, separated by data bits for which no phase shift is detected, even by data bits exhibiting a phase shift in the opposite direction, subsequently compensated by other subsequent data bits. This second type of filtering therefore detects a general drift of the phase over at least M data bits.

The fact of retaining only a portion of the bits (of high weight) of the parallel digital output of the accumulator circuit in order to act as control signal of the injection-locked oscillator makes it possible to implement in this way a second type of filtering having rather different characteristics from the first type of filtering. Be that as it may, the filtering implemented on the variations of the phase shifts is adapted in accordance with the dynamic response desired for the feedback loop.

In the embodiment variants of the device according to the invention in which the two types of filtering are used successively in combination, the fact of being able to implement this filtering in two successive stages, one of which is constituted by the decision-making converter, and the other by said accumulator circuit, makes it possible, in particular, to reduce the working frequency of the accumulator, facilitating its use at high frequency. In addition, the first type of filtering makes it possible to minimise the risk of a variation of the high-frequency control signal when the data exhibit an accidental phase drift (jitter), whereas said accumulator circuit has previously down-counted a number of successive data bits of identical phase shifts close to the threshold value which triggers the variation of the control signal. In order to avoid this phenomenon of variations at high frequency, it is also possible to implement the accumulator circuit with the aid of several adders and/or several counters in cascade with a device for reloading of an intermediate value, for example a median value, when said threshold value has been exceeded, so that the accumulator circuit resumes the counting/down-counting from this intermediate value.

This/these digital filtering(s) resulting from the structure of the decision-making converter and/or from the link between the accumulator circuit and the digital control input of the injection-locked oscillator make(s) it possible to dispense with any specific filtering component in the phase-locked loop.

In an advantageous embodiment and according to the invention, the digital control input of the injection-locked oscillator is connected to a circuit including a plurality of switches, each switch being connected in series to at least one integrated condenser in the circuit of the oscillator in such a way as to modify its natural frequency. Advantageously and according to the invention, each bit of the digital control input is linked to one of the switches.

In addition, advantageously and according to the invention the clock-extraction circuit includes, in addition, a circuit, known as the synchronisation-pulse generator, generating a current-pulse signal at the frequency of edges of the received signal and adapted for operation of the injection-locked oscillator, this synchronisation-pulse generator being adapted to supply the current-pulse signal to a single output connected solely to a current input of the injection-locked oscillator. The current pulses supplied by this synchronisation-pulse generator are adapted at the input of the injection-locked oscillator in such a way as to ensure its operation—that is to say, the locking of the oscillator onto the clock-bit frequency fsr.

Furthermore, any type of injection-locked oscillator may be used within the scope of the invention. It may be a question, in particular, of a relaxation oscillator of RC type or with current-source, of an unstable oscillator with logic gates or coupled transmitters, of a ring oscillator, of a quasi-sinusoidal oscillator with Wien bridge, phase displacement or LC, of a Colpitts, Hartley, Clapp, Pierce oscillator or with negative resistance with LC resonant circuit, with transmission lines or quartz-type resonator, a resonator with surface waves, with integrated MEMS or piezoelectric element, etc. Nevertheless, advantageously and according to the invention the injection-locked oscillator is of the type constituted by an LC resonant circuit. Such an oscillator exhibits, in particular, the advantage of minimising the intrinsic phase drift (jitter). More particularly, advantageously and according to the invention the injection-locked oscillator includes two branches, each including a field-effect transistor with negative resistance, the two transistors being coupled in accordance with a differential topology. It may be a question of an oscillator as described in FR 2 838 265.

In this way, the invention makes it possible to bring about decisive advantages in the design of clock-extraction devices, and more particularly of devices for clock extraction and extraction of digital data, enabling development on an industrial scale of a circuit, the operation of which is based on an injection-locked oscillator.

In particular, a device according to the invention is free from charging pump and from loop filter, and more generally from analogue component in the phase-locked loop. Consequently, in a device according to the invention the phase-locked loop can be developed with a homogeneous, entirely digital, simple and fast design.

A device according to the invention is also completely autonomous—that is to say, it requires no manual or other external adjustment, nor any calibration. In this way, advantageously a device according to the invention is free from any means for external manual adjustment. Moreover, this autonomy is obtained with great simplicity of implementation.

A device according to the invention does not require the presence of an external frequency reference either, unlike a traditional PLL. In addition, a few data bits are sufficient to ensure synchronisation at start-up. By virtue of its very great simplicity, the architecture of a device according to the invention enables its implementation with a very small number of elementary components having low energy consumption (therefore a reduced total surface area and a lower total consumption). A device according to the invention can also be designed using digital technology, particularly so far as the phase-locked loop is concerned, without requiring the intervention of a designer possessing considerable know-how (unlike the prior devices based on PLL, in which, in particular, it is very difficult to implement a phase/frequency comparator operating at high frequency). With a device according to the invention of simple design it is also possible to attain transmission speeds close to the limits offered by semiconductor technology. In a particular case it is possible to attain transmission speeds that are substantially higher than with prior circuits based on PLL or DLL. In addition, it is possible to implement a device according to the invention with any semiconductor technology (CMOS, bipolar, SiGe, . . . ).

Unlike a circuit based on DLL, a device according to the invention is quite insensitive to noises in the received signal, and the coding of the data exhibits a rate of expansion similar to that of a traditional PLL—that is to say, much lower than that required for a DLL.

Furthermore, in view of the simplicity and effectiveness of the phase-control loop, in a device according to the invention the natural frequency fos of the oscillator is always equal to the clock-bit frequency fsr of the reception clock signal; consequently, the phase deviation between the clock signal supplied by the oscillator and the received signal is fixed. Now, since the totality of the other elements constituting the device are capable of bringing about a constant phase displacement between the two inputs of the sampling circuit, it is possible to determine the constant structural differential phase lag between these two inputs of the sampling circuit. Consequently, it is sufficient to provide one (or more) phase-shifting circuits in order to guarantee a phase alignment between the two inputs of the sampling circuit without requiring any external adjustment, so that the device according to the invention can operate autonomously and stably with a wide lock-in range. In addition, in a device according to the invention the sampling circuit may be simply constituted by a simple flip-flop D.

It should be noted in this respect that this/these phase-shifting circuit(s) is/are provided in supplement to the possible phase-shifting circuit sometimes necessarily provided at the input of a circuit such as a phase comparator, in order to compensate the phase displacements introduced by certain architectures of this type of circuit. Such a phase-shifting circuit which is necessary for the operation of a phase comparator which it feeds is functionally different from the phase-shifting circuit(s) of a device according to the invention, the function of which is to introduce a supplementary phase displacement in order to compensate the total phase displacement between the two inputs of the sampling circuit.

Advantageously a device according to the invention is implemented in the form of at least one integrated circuit incorporating at least the injection-locked oscillator. A device for clock extraction and for extraction of digital data according to the invention is adapted to be able to operate with a clock-bit frequency fsr higher than 500 MHz.

In this way, the invention makes it possible, for the first time, to obtain a clock-extraction circuit, and more particularly a circuit for clock extraction and for extraction of digital data, that is perfectly autonomous and stable, being capable of being the object of utilisation on an industrial scale in numerous applications.

The invention also relates to a clock-extraction device, and more particularly a device for clock extraction and for extraction of digital data, characterised in combination by all or some of the characteristics mentioned above or below.

BRIEF DESCRIPTION OF THE DRAWINGS

Other aims, characteristics and advantages of the invention will become apparent from the following description which is given by way of non-limiting example and which refers to the appended Figures, in which.

DETAILED DESCRIPTION OF THE INVENTION

Figure 1:
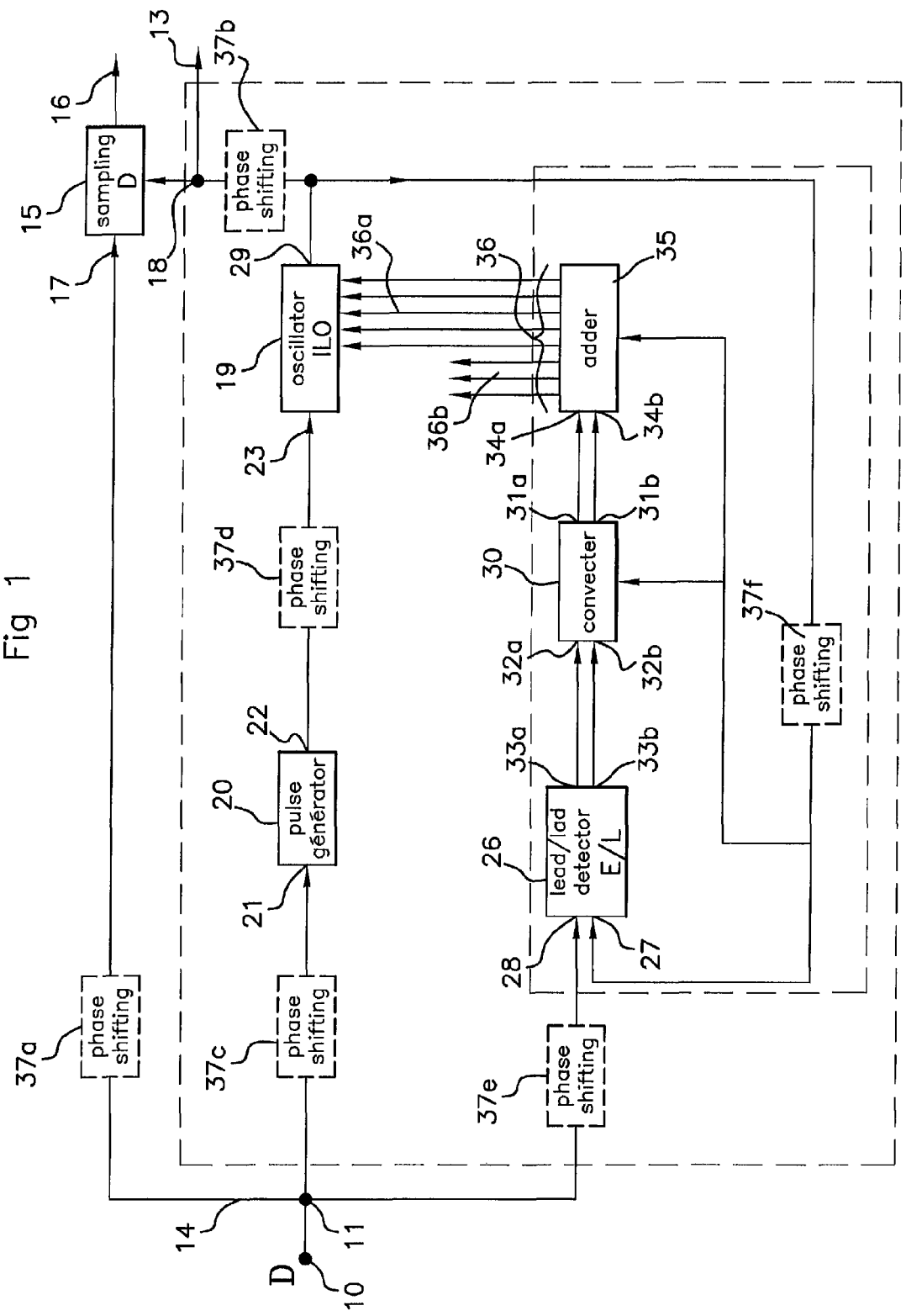
FIG. 1 is a general functional block diagram illustrating a device for clock extraction and for extraction of digital data according to a first embodiment of the invention.

A device for clock extraction and for extraction of digital data according to the invention which is represented in FIG. 1 receives at a principal input, known as the reception input 10, a signal, known as the received signal, which is a baseband serial signal that is representative of digital data D and that is coded with a clock signal exhibiting a clock-bit frequency fsr. In general, this received signal is a coded signal of type NRZ (non-return to zero) received on a transmission channel of a baseband serial link. This transmission channel may be constituted by a single electrically conductive wire or by a single optical fibre or by a single-channel radiofrequency link (non-differential signal). The invention is nevertheless also applicable in the case of a received signal of the type transmitted differentially, the transmission channel then including two lines transmitting two components in phase opposition. The invention is also applicable to other types of coding of the received signal, for example NRZI (non-return to zero inverted).

The reception input 10 is connected to a branching node 11 to which two branches are connected in parallel, namely a first clock-extraction branch 12 according to the invention, generating at a clock output 13 a clock signal, known as the reception clock signal H, synchronised and in phase with the clock-bit frequency fsr of the received signal, and another, second branch 14 including a circuit 15 for sampling the received signal with the reception clock signal H, this sampling circuit 15 being adapted to supply, at a data output 16, digital data transmitted by the received signal.

The clock-extraction circuit 12 includes an injection-locked oscillator 19 which is fed by a synchronisation-pulse generator 20, this latter exhibiting an input 21 connected to the node 11 of the reception input 10. The synchronisation-pulse generator 20 exhibits a single output 22 (which may be constituted by two lines in the case of a differential topology) connected solely to the current input 23 of the injection-locked oscillator 19. The current-pulse signal provided by the synchronisation-pulse generator 20 is adapted to the operation of the injection-locked oscillator 19 and is clocked at the frequency of edges of the data D of the received signal. This can be implemented, for example, as described by FR 2 838 265. In particular, the injection-locked oscillator 19 is then of the type constituted by a symmetrical LC resonant circuit defining the frequency of free oscillations fos of oscillation and endowed with two crossed branches, each including a field-effect transistor with negative resistance, the two transistors being in this way coupled in accordance with a differential topology. The injection-locked oscillator 19 exhibits a clock output 29 supplying a clock signal that is synchronised and in phase with the clock-bit frequency of the received signal.

The sampling circuit 15 includes a first input, known as the signal input 17, connected by the second branch 14 to the reception input 10, and a second input, known as the clock input 18, connected to the clock output of the clock-extraction circuit 12—that is to say, to the clock output 29 of the oscillator 19. This sampling circuit 15 may be constituted by a simple flip-flop D.

The injection-locked oscillator 19 includes, furthermore, an input, known as the control input, which is adapted so that the value of the natural frequency fos of the oscillator depends on the value of the digital control signal received at this control input. The control input is a digital parallel input which, in the example represented, comprises 5 bits 24a, 24b, 24c, 24d, 24e.

The oscillator 19 may be constructed from any type of oscillator, since it can be adapted in order to exhibit a digital control input as described below. It may be a question, in particular, of a relaxation oscillator of RC type or with current-source, of an unstable oscillator with logic gates or coupled transmitters, of a ring oscillator, of a quasi-sinusoidal oscillator with Wien bridge, phase displacement or LC, of a Colpitts, Hartley, Clapp, Pierce oscillator or with negative resistance with LC resonant circuit, with transmission lines or quartz-type resonator, a resonator with surface waves, with MEMS or integrated piezoelectric element, etc.

Figure 4:
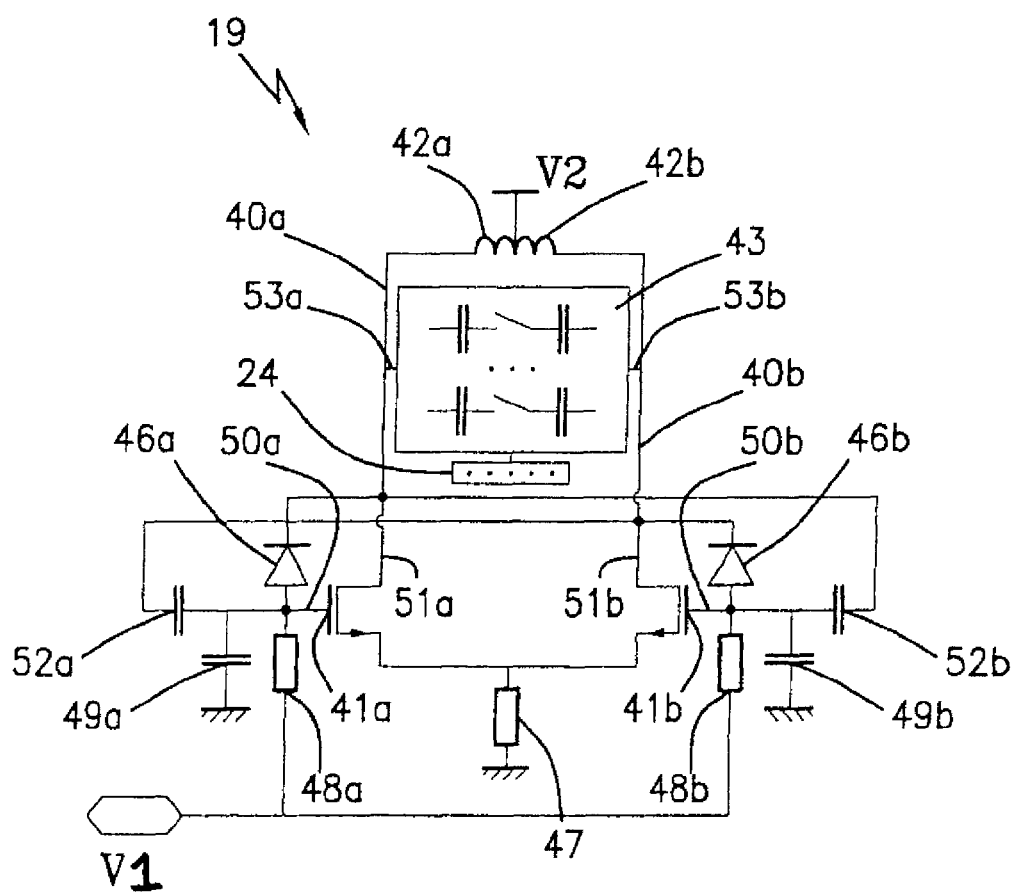
FIG. 4 is a diagram illustrating an embodiment of an injection-locked oscillator that is capable of being used in a device according to the invention.

The oscillator 19 is, for example, implemented as described by FR 2 838 265 and represented schematically FIG. 4. It is then of the type constituted by a symmetrical LC resonant circuit defining the frequency of free oscillations fos and endowed with two crossed branches 40a, 40b, each including a field-effect transistor 41a, respectively 41b, with negative resistance, the two transistors 41a, 41b being in this way coupled in accordance with a differential topology. The pair of transistors 41a, 41b is charged by a symmetrical LC circuit defining the oscillation frequency starting from a reference polarisation voltage V2 applied between two inductors 42a, respectively 42b, and from a current-source 47, the output of which is at the lowest potential and which may be simply constituted by a series resistor connected to a junction node of the two sources of the transistors 41a, 41b.

Each transistor 41a, 41b is furthermore polarised by an appropriate polarisation voltage V1 applied to its drain 50a, 50b by means of a series resistor 48a, 48b and a parallel capacitor 49a, 49b.

Figure 7:
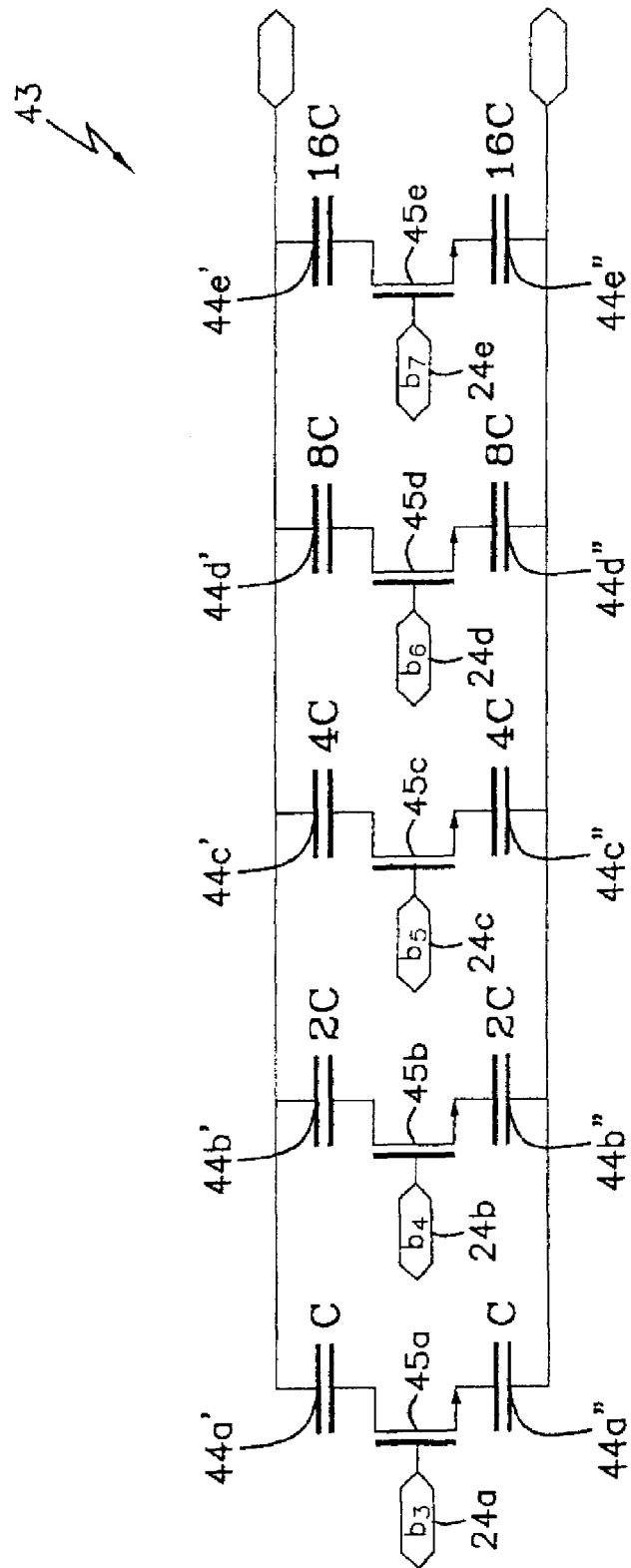
FIG. 7 is a diagram illustrating an embodiment of a block of capacitors at the digital control input of the oscillator shown in FIG. 4.

The parallel capacitors of the LC resonant circuit are constituted by a block 43 of capacitors, each associated respectively with a switch 45a, 45b, 45c, 45d, 45e, each switch receiving one of the bits 24a, 24b, 24c, 24d, 24e of the parallel digital control input of the oscillator 19. The parallel capacitors are associated in such a way that the variation of an increment (a unit) of the digital signal received at input brings about a variation of an identical value Δf of the oscillation frequency fos of the oscillator 19. In the embodiment shown in FIG. 8, each switch 45a, 45b, 45c, 45d, 45e is interposed between two condensers 44a', 44b', 44c', 44d', 44e', and, respectively, 44a", 44b", 44c", 44d", 44e", of identical value arranged symmetrically in series in relation to this switch, these two condensers constituting said capacitor which is associated with the switch. Each switch 45a, 45b, 45c, 45d, 45e is constituted by a field-effect transistor, and the values of the capacitances are equal to $2^n \times 2C$, n being the rank (0, 1, 2, 3, 4) of the bit b3, b4, b5, b6, b7 being considered of the digital control signal applied at the digital input 24a, 24b, 24c, 24d, 24e, C being a predetermined capacitance value, and the capacitance value of each condenser 44a', 44a", 44b', 44b", 44c', 44c", 44d', 44d", 44e', 44e" being respectively equal to C, C, 2C, 2C, 4C, 4C, 8C, 8C, 16C, 16C, as represented in FIG. 7.

The value of the variation step Δf is chosen to be sufficiently low, preferably lower than 1% of the mean value of the oscillation frequency fos, in particular of the order of 0.3% of this mean value. For example, Δf is of the order of 30 MHz for an oscillation frequency fos of the order of 10 GHz.

The amplitude of oscillation of the oscillator 19 is controlled with the aid of two diodes 46a, respectively 46b, mounted between the drain 50a, 50b and the grid 51a, 51b of each corresponding transistor 41a, 41b by means of a filtering capacitor 52a, 52b.

The clock-extraction circuit 12 of the device according to the invention includes a phase-control loop 25 entirely constituted by digital components. This phase-control loop 25 includes a lead/lag detector 26 exhibiting two inputs 27, 28. The first input 27 of the lead/lag detector 26 is connected to the output 29 of the oscillator 19 in such a manner as to receive the reception clock signal H generated by the oscillator at this output 29. The second input 28 is connected to the branching node 11 and therefore to the reception input 10. In this way, the received signal is supplied to the second input 28 of the lead/lag detector 26.

Figure 2:
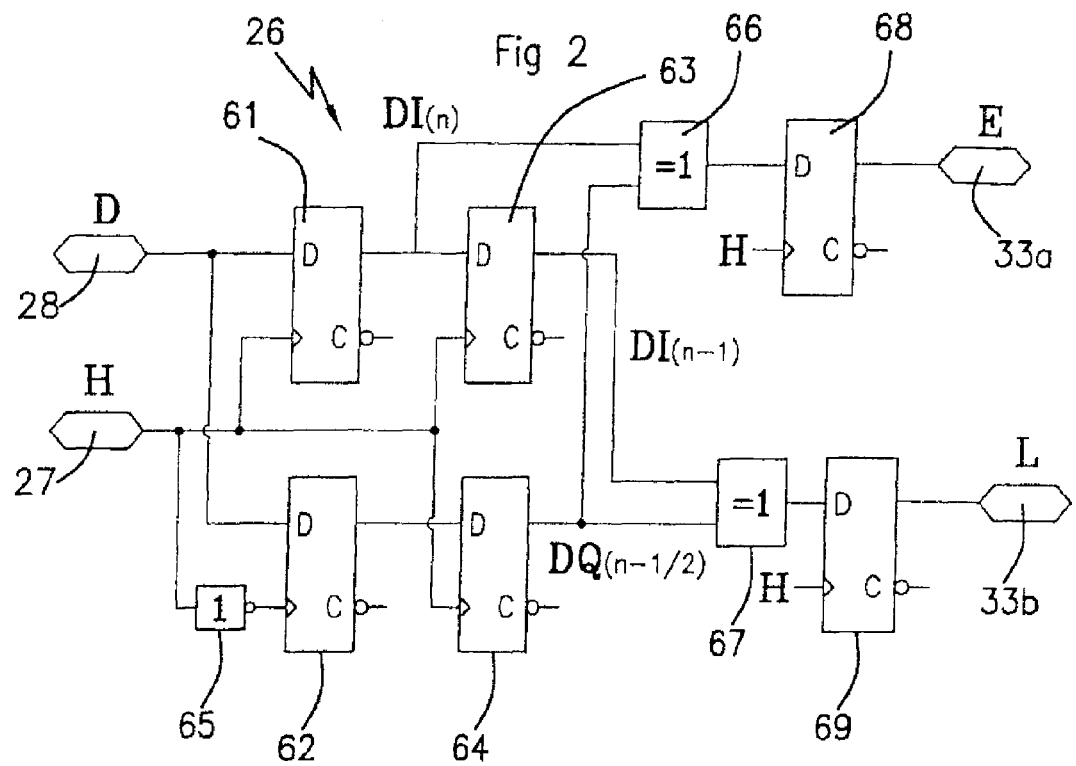
FIG. 2 is a functional block diagram of an embodiment of the lead/lag detector of the device shown in FIG. 1.

An embodiment of the lead/lag detector 26 is represented in FIG. 2. This lead/lag detector 26 exhibits two parallel digital outputs 33a, 33b, to each of which it supplies a signal, known as the phase-state signal E, respectively L, that is representative of the existence and of the direction of a phase shift between its two inputs 27, 28—that is to say, between the data D of the received signal and the reception clock signal H provided by the oscillator 19. In particular, the signals E and L supplied respectively to the parallel digital outputs 33a, 33b of the lead/lag detector 26 are zero when the signals at its two inputs 27, 28 are in phase. The first output 33a of the lead/lag detector 26 is a digital signal E on 1 bit which identifies the presence of a phase lead between the two inputs 27, 28. In the example described, this signal E is equal to 1 when a phase lead is detected and is equal to 0 when the two inputs 27, 28 are in phase. The second output 33b of the lead/lag detector 26 supplies a digital signal L on 1 bit which identifies the presence of a phase lag between the two inputs 27, 28. In the example described, this signal L is equal to 1 when a phase lag is detected, and is equal to 0 when the two inputs 27, 28 are in phase.

Any type of digital lead/lag detector 26 may be used in a device according to the invention. It may be a question, in particular, of an Alexander cell (cf. J. D. H. Alexander "Clock recovery from random binary signals" Electronics Letters 30 Oct. 1975 Vol. 11 No. 22). In this way, in the embodiment represented in FIG. 2 the lead/lag detector 26 is constituted by an Alexander cell based on a double sampling of the received signal, a first time in phase with the reception clock signal H, a second time in quadrature with this signal. In this way, this lead/lag detector 26 includes a first stage of two flip-flops D 61, 62 receiving the received signal and the reception clock signal H, a quadrature-shift gate 65 being interposed at the input of the second flip-flop D 62 of the first stage at its terminal receiving the clock signal. The detector 26 includes a second stage of two flip-flops D 63, 64 and two exclusive OR gates 66, 67 in order to form the signals that are representative of the phase shift. The output of the first flip-flop 61 of the first stage provides a signal DI(n) that is representative of the in-phase sampling of a bit n of the received signal. The output of the first flip-flop 63 of the second stage connected downstream of the first flip-flop 61 of the first stage provides a signal DI(n−1) that is representative of the in-phase sampling of bit n−1 immediately preceding said bit n in the received signal. The output of the second flip-flop 62 of the first stage provides a signal DQ(n+½) that is representative of in-quadrature sampling between the data bits n and n+1. The output of the second flip-flop 64 of the second stage provides a signal DQ(n−½) that is representative of the in-quadrature sampling between the data bits n and n−1. Two flip-flops D 68, 69 are furthermore provided, in order to form an output register making it possible to synchronise the signals with the reception clock.

The following Table 1 is a truth table of an example of a particular lead/lag detector 26:

TABLE 1

| DI (n − 1) | DQ (n − ½) | DI (n) | E | L | Meaning |
|---|---|---|---|---|---|
| 0 | 0 | 0 | 0 | 0 | in phase |
| 0 | 0 | 1 | 1 | 0 | lead |
| 0 | 1 | 0 | 1 | 1 | impossible |
| 0 | 1 | 1 | 0 | 1 | lag |
| 1 | 0 | 0 | 0 | 1 | lag |
| 1 | 0 | 1 | 1 | 1 | impossible |
| 1 | 1 | 0 | 1 | 0 | lead |
| 1 | 1 | 1 | 0 | 0 | in phase |

It should be noted that the digital phase detector constituted by the lead/lag detector 26 makes it possible to detect solely the existence of a phase shift and its direction, but not the amplitude of this phase shift.

Figure 3:
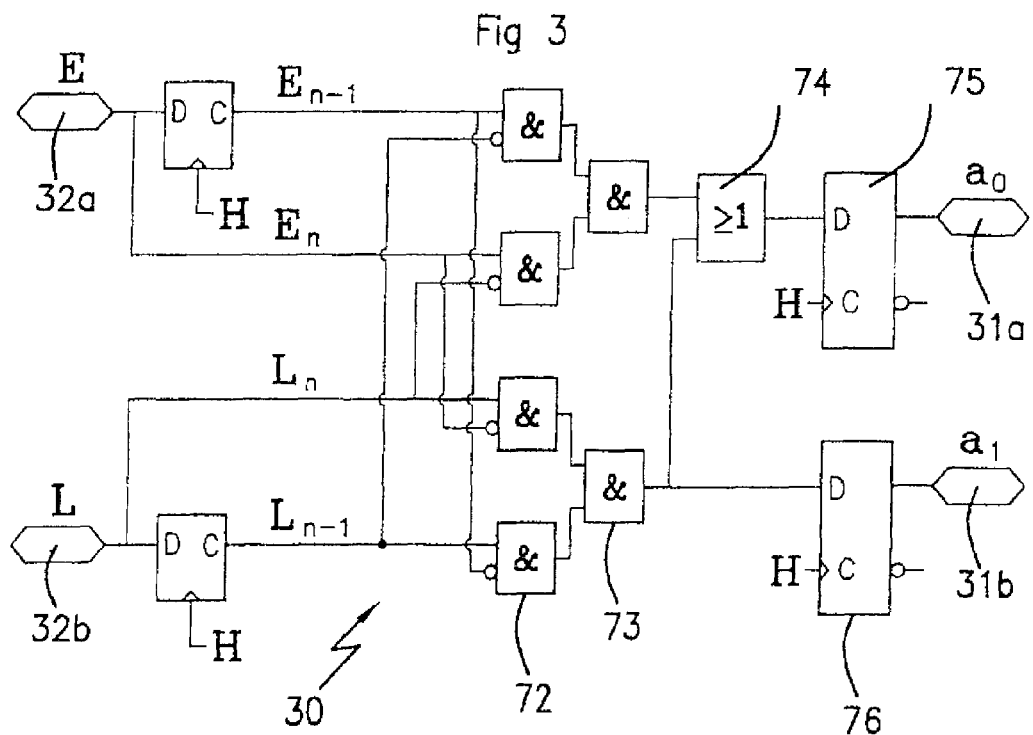
FIG. 3 is a functional block diagram of an embodiment of the decision-making converter of the device shown in FIG. 1.

The two outputs 33a, 33b of the lead/lag detector 26 are connected respectively to two inputs 32a, 32b of a decision-making converter circuit 30 of the phase-control loop, an exemplary embodiment of which is given FIG. 3. This decision-making converter circuit 30 makes it possible to supply to a parallel digital output with two terminals 31a, 31b a digital signal, known as the filtered phase-state signal, having three states according to the values taken by the phase-state signal—that is to say, the lead signals E and lag signals L supplied for each data bit of the received signal by the lead/lag 26 converter.

The decision-making converter 30 modifies the value of the filtered phase-state signal supplied to its parallel digital output only when it receives successively a predefined number of identical values at its inputs 32a, 32b corresponding to a predefined number of successive data bits of the received signal for which the lead/lag detector 26 has detected a phase shift in the same direction.

The filtered phase-state signal is, for example, a signed binary signal coded on two bits a0 and a1, each bit corresponding to one of the two output terminals 31a, 31b. When the phase shifts of the successive data bits detected are in a first direction, for example when the reception clock signal H is leading, the filtered phase-state signal is equal to 1, coded by the values a0=1 and a1=0. When the phase shifts of the successive data bits detected are in the other direction, for example when the reception clock signal H is lagging, the filtered phase-state signal is equal to −1, coded by the values a0=a1=1. When the data bits are in phase, the filtered phase-state signal is zero, coded by the values a0=a1=0.

Consequently, the function of the decision-making converter 30 is to implement a filtering of the variations of the phase shift detected by the detector 26 in order to take into account only the phase shifts that are reproduced in a number n, greater than 1, of successive data bits of the received signal. The function of the decision-making converter 30 is also to convert the phase-state signals E and L into filtered phase-state signals a0 and a1.

This decision-making converter 30 includes, firstly, a stage of two flip-flops D making it possible to store the states E(n−1), L(n−1) of each of the signals E and, respectively, L received at its inputs 32a, 32b for a bit n−1 in relation to the state E(n), L(n) of these signals for an immediately successive bit n. The decision-making converter 30 includes, in addition, two stages of AND gates 72, 73 and an OR gate 74 making it possible, in the example represented, to detect the states of each of the signals E and, respectively, L received at its inputs 32a, 32b remaining identical on two successive data bits. It is sufficient to multiply the input flip-flops D and the AND gates in order to increase the number of successive data bits taken into account by the decision-making converter.

Two flip-flops D 75, 76 are furthermore provided, in order to form an output register making it possible to synchronise the signals a0, a1 supplied to the output terminals 31a, 31b of the decision-making converter 30 with the reception clock.

The following Table 2 is a truth table of an example of a decision-making converter 30 for which n=2:

TABLE 2

| $E_{(n)}$ | $E_{(n-1)}$ | $L_{(n)}$ | $L_{(n-1)}$ | $a_1$ | $a_0$ | Relative value of counting/down-counting signal | Remarks |
|---|---|---|---|---|---|---|---|
| 0 | 0 | 0 | 0 | 0 | 0 | +0 | |
| 1 | 0 | 0 | 0 | 0 | 0 | +0 | 1$^{st}$ cycle where E = 1 |
| 1 | 1 | 0 | 0 | 0 | 1 | +1 | 2$^{nd}$ successive cycle where E = 1 |
| 1 | 1 | 0 | 0 | 0 | 1 | +1 | 3$^{rd}$ successive cycle where E = 1 |
| 0 | 1 | 0 | 0 | 0 | 0 | +0 | 1$^{st}$ cycle where E passes through 0 |
| 0 | 0 | 0 | 0 | 0 | 0 | +0 | |
| 0 | 0 | 1 | 0 | 0 | 0 | +0 | 1$^{st}$ cycle where L = 1 |
| 0 | 0 | 1 | 1 | 1 | 1 | −1 | 2$^{nd}$ successive cycle where L = 1 |
| 0 | 0 | 1 | 1 | 1 | 1 | −1 | 3$^{rd}$ successive cycle where L = 1 |
| 0 | 0 | 0 | 1 | 0 | 0 | +0 | 1$^{st}$ cycle where L passes through 0 |
| 0 | 0 | 0 | 0 | 0 | 0 | +0 | |

The two output terminals 31a, 31b of the decision-making converter 30 are connected to two input terminals 34a, 34b of an adder 35 of the phase-control loop. This adder 35 is adapted to aggregate the relative values +1, 0, −1 of the filtered phase-state signal. In the example described, adder 35 exhibits a parallel output 36 on 8 bits to which the result of the aggregate is applied. According to the invention, not all the bits of output 36 are used in order to control the oscillator 19. In fact, only the high-weight bits 36a of the signal supplied to the parallel output 36 are used in order to constitute the parallel digital control signal supplied by adder 35 to the oscillator 19. The low-weight bits 36b, which in reality are representative solely of the relative phase noise (jitter) are not used. In the example represented, the 5 high-weight bits are used by way of control signal of the oscillator 19. By virtue of this, by using only a portion of the high-weight bits of the signal at the output of adder 35 a filtering is implemented by continuous integration of the signal provided by the digital phase detector 26, 30.

Figure 5:
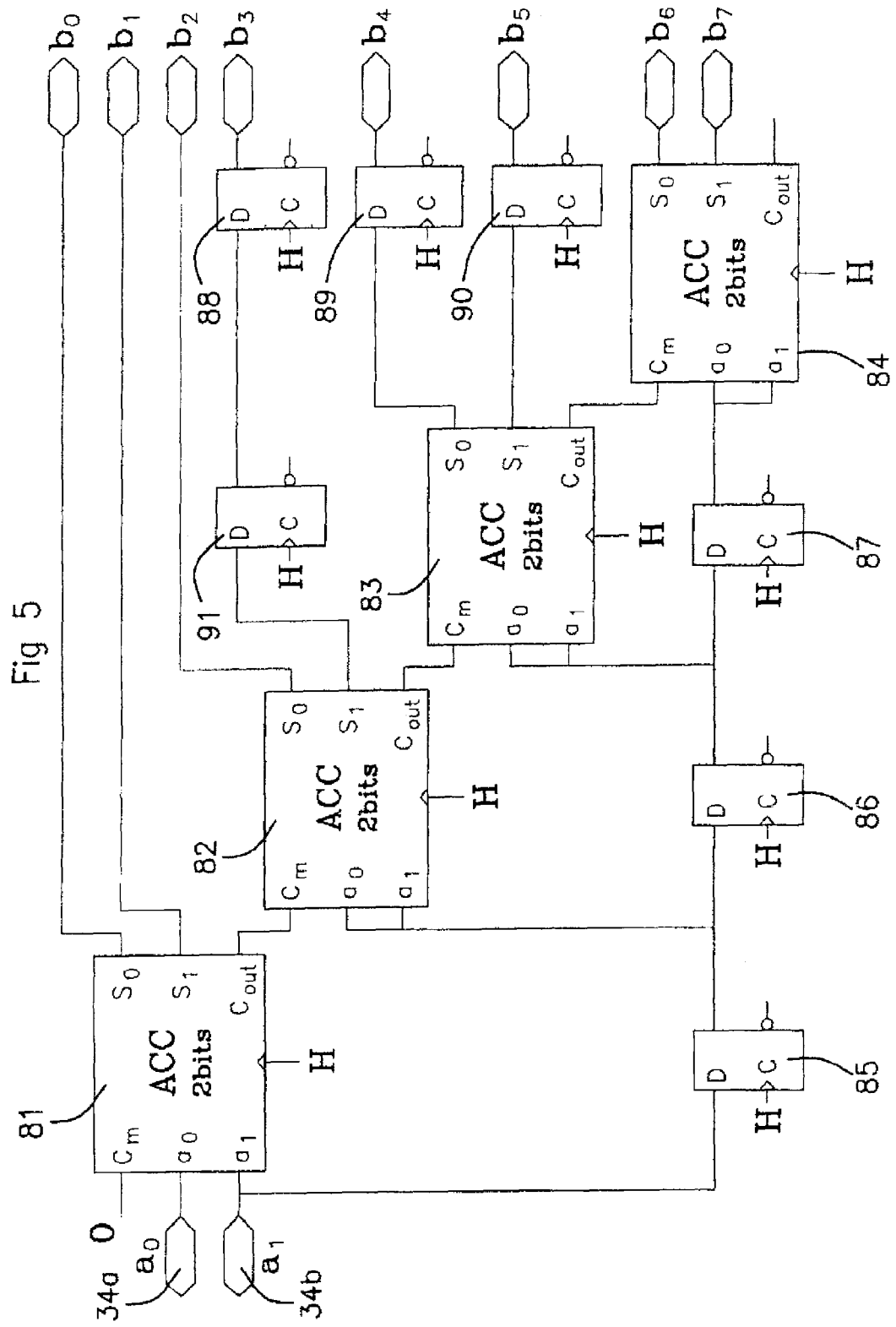
FIG. 5 is a diagram illustrating an exemplary embodiment of an 8-bit adder that is capable of being used in the device shown in FIG. 1.
Figure 6:
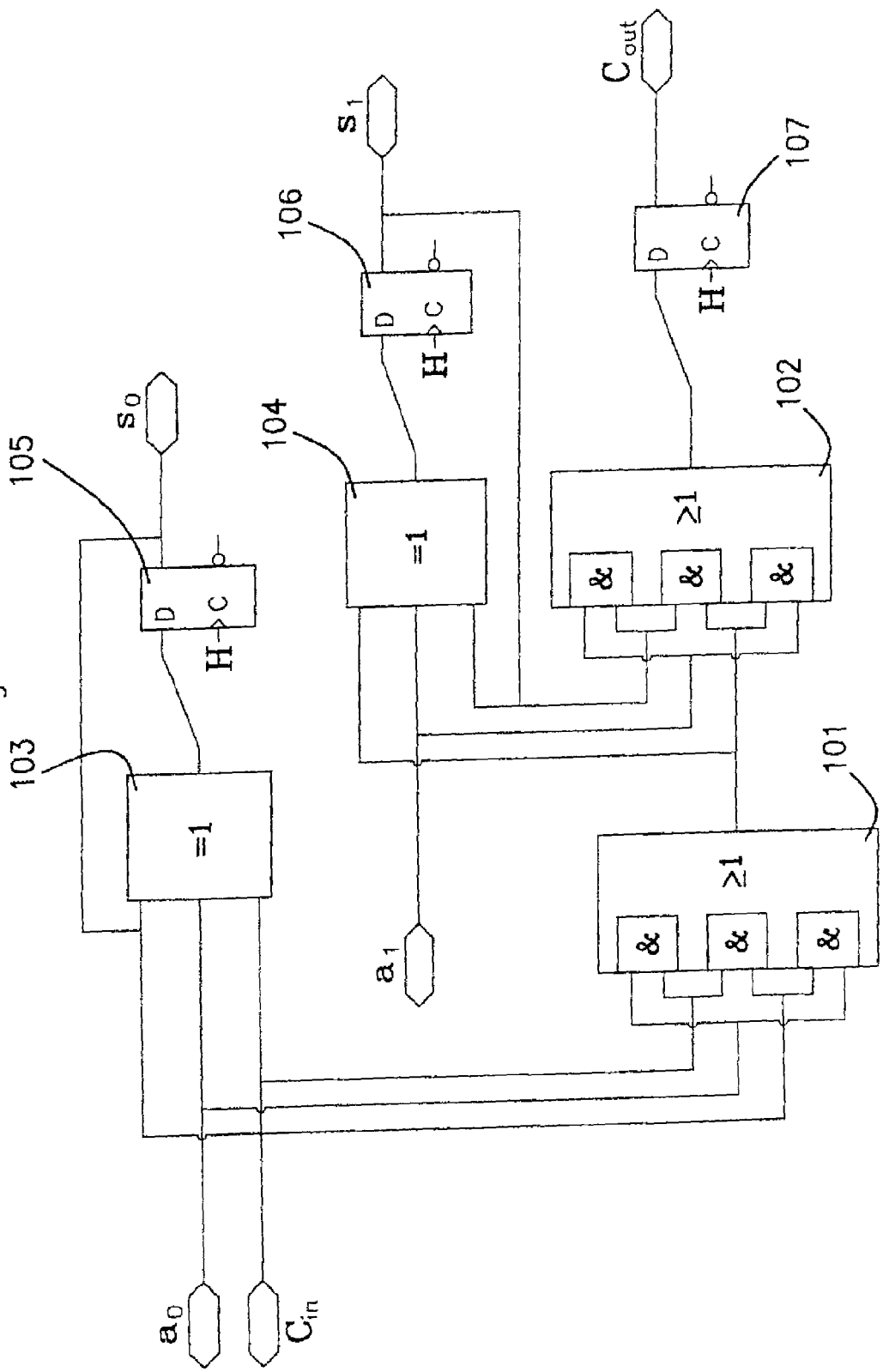
FIG. 6 is a diagram illustrating an exemplary embodiment of a 2-bit accumulator that is capable of being used in order to implement the adder shown in FIG. 5.

FIG. 5 represents an exemplary embodiment of such an adder 35 constituted by a cascade of four 2-bit accumulators 81, 82, 83, 84 in series. FIG. 6 represents an exemplary embodiment of a 2-bit accumulator that is capable of being used in the adder shown in FIG. 5. Such a 2-bit accumulator is constituted by two AND/OR gates 101, 102 and two exclusive OR gates 103, 104 with three inputs. Three flip-flops D 105, 106, 107 constitute an output register.

In adder 35 the four 2-bit accumulators 81, 82, 83, 84 are assembled in accordance with a pipeline architecture including three synchronisation flip-flops D 85, 86, 87 and an output register constituted by three flip-flops D 88, 89, 90, by the output flip-flops 105, 106 of the first 2-bit accumulator 81, by the output flip-flop 105 of the second 2-bit accumulator 82, and by the output flip-flops 105, 106 of the last 2-bit accumulator 84. The 8-bit adder makes it possible to supply at the output a signal aggregated on 8 bits b0, b1, b2, b3, b4, b5, b6, b7. In the example described, only the high-weight bits b3, b4, b5, b6, b7 are supplied to the injection-locked oscillator 19. It goes without saying that any other known structure of an 8-bit adder exhibiting the same functions may be used within the scope of the invention.

It should be noted that the phase-control loop 25 of a device according to the invention exhibits properties of self-adaptation at the level of the phase noise of the received signal, since the gain of this phase-control loop decreases when the standard deviation of the phase noise increases, which in fact brings about a reduction of the overall pass-band of the filter.

The double digital filtering implemented by the decision-making converter 30, on the one hand, and by the suppression of the low-weight bits at the output of adder 35, on the other hand, makes it possible to dispense with the use of an analogue loop filter.

In a device according to the invention, no manual external adjustment is necessary so far as the natural frequency fos of the oscillator 19 is concerned. In addition, whatever the received signal, the phase-control loop 25 makes it possible to ensure that the reception clock signal H provided by the oscillator 19 is always in phase with the received signal.

Under these conditions, in a device according to the invention the phase shifts due to the propagation delays in the various branches of the circuit are all known and constant and may therefore be compensated by a phase-shifting circuit (or several such circuits) 37 placed between the branching node 11 and each of the inputs 17, 18 of the sampling circuit 15. It is, in fact, important that the sampling circuit 15 implements a sampling of the received signal in the central zone of the period of each data bit of the received signal where the value of the corresponding voltage is most stable and where the noise margin is the greatest, in order to avoid implementing the sampling at the start or at the end of the period of each bit where the voltage of the signal is subjected, in the course of set-up, to a phase drift traditionally designated as jitter). In that the received signal, which is generally noisy, each bit appears in the form of an 'eye', taking into account the phase drift (jitter). The sampling has to take place in the centre of the eye.

Now, since the difference between the clock-bit frequency fsr of the received bits and the oscillation frequency fos of the oscillator 19 is zero in a device according to the invention and the totality of the lags that are capable of being introduced by the other components of the circuit and the totality of the propagation delays in the various branches of the circuit are controlled and known, it is possible to determine the structural and constant differential phase lag between the data contained in the received signal and the reception clock signal H supplied by the oscillator 19. This differential lag is compensated by the phase-shifting circuit(s) 37.

A single phase-shifting circuit 37 may be provided in the device according to the invention at any appropriate place. In a variant, the phase displacement between the two branches 12, 14 can be obtained by means of a plurality of phase-shifting circuits 37 distributed at several places in each branch. In this last case the aggregate of the phase displacements introduced by each phase-shifting circuit 37 is equal to the total phase displacement that has to be implemented between the two branches 12, 14.

In FIG. 1 possible locations at which a phase-shifting circuit 37 may be provided are represented by different dotted lines. In this way, a phase-shifting circuit 37a may be provided between the branching node 11 and the signal input 17 of the sampling circuit 15; a phase-shifting circuit 37b between the output 29 of the oscillator 19 and the clock input 18 of the sampling circuit 15; a phase-shifting circuit 37c between the branching node 11 and the input 21 of the pulse-generator 20 feeding the oscillator 19; a phase-shifting circuit 37d between the output 22 of the pulse-generator 20 and the input 23 of the oscillator 19; a phase-shifting circuit 37e between the branching node 11 and the second input 28 of the lead/lag detector 26; a phase-shifting circuit 37f between the output 29 of the oscillator 19 and the first input 27 of the lead/lag detector 26. Each phase-shifting circuit 37 may be constituted by a simple delay line.

The architecture of a device according to the invention is intrinsically very insensitive to transient events such as the changes of state of a signal that are due to an ionising particle once the oscillator 19 is in locked mode. In fact, the synchronisation of the oscillator with the clocking of the received signal makes it possible to mask the perturbations of external origin.

Figure 8:
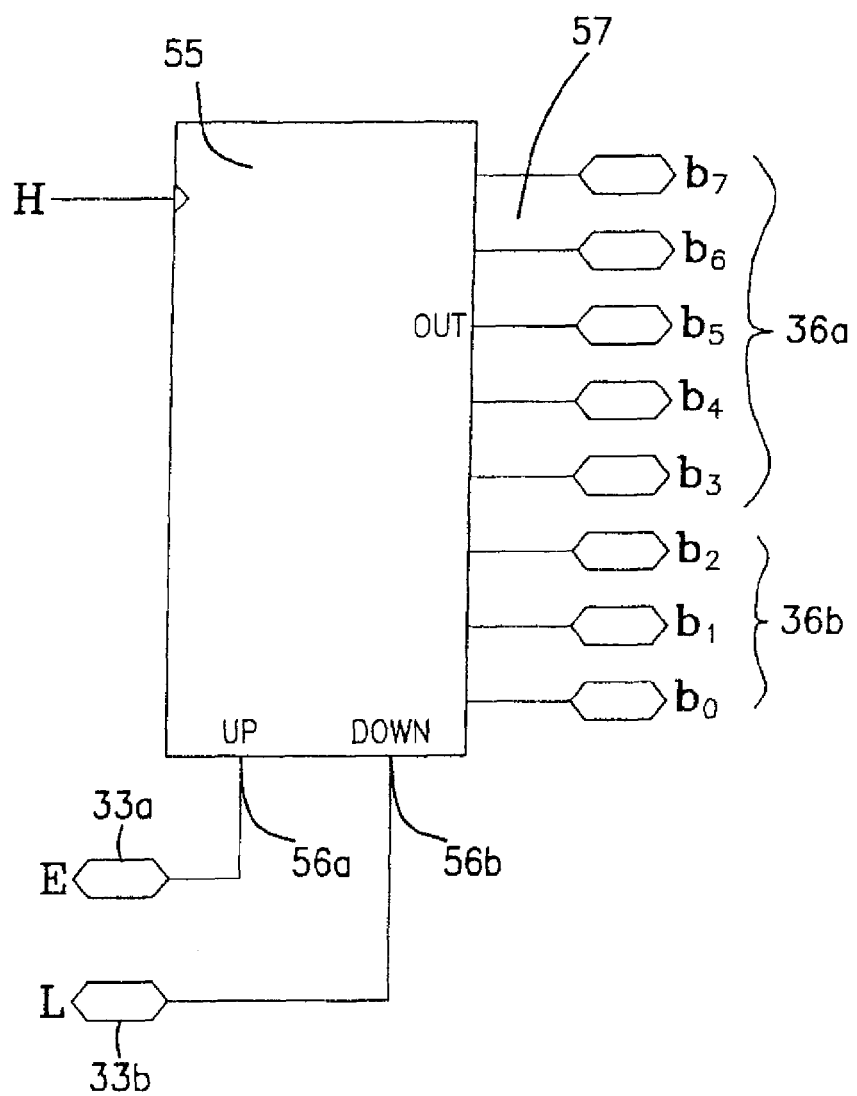
FIG. 8 is a diagram illustrating a second embodiment of a counting circuit of a device according to the invention.

FIG. 8 represents a second embodiment of a counting circuit that is capable of being used in a device according to the invention. This second embodiment differs from the previous one in that the decision-making converter 30 and the adder circuit 35 are replaced by a single counting/down-counting circuit component 55 which exhibits an output 57 on 8 bits and receives directly at its input the phase-state signal supplied by the phase detector 26, namely the phase-lead signal E at its counting input 56a (UP) connected to the first output 33a of the lead/lag detector 26, and the phase-lag signal L at its down-counting input 56b (DOWN) connected to the second output 33b of the lead/lag detector 26. The counter/down-counter 55 is clocked by the reception clock signal H. It is chosen in such a way that the value of its output 57 remains unmodified when the values exhibited at its inputs 56a and 56b are inactive.

A single level of filtering is obtained by virtue of the fact that, as in the previous first embodiment, only a portion (b3, b4, b5, b6, b7 in the example represented) of the high-weight bits of the output signal supplied by the counter/down-counter 55 is used in order to form the control input of the oscillator 19.

Figure 9:
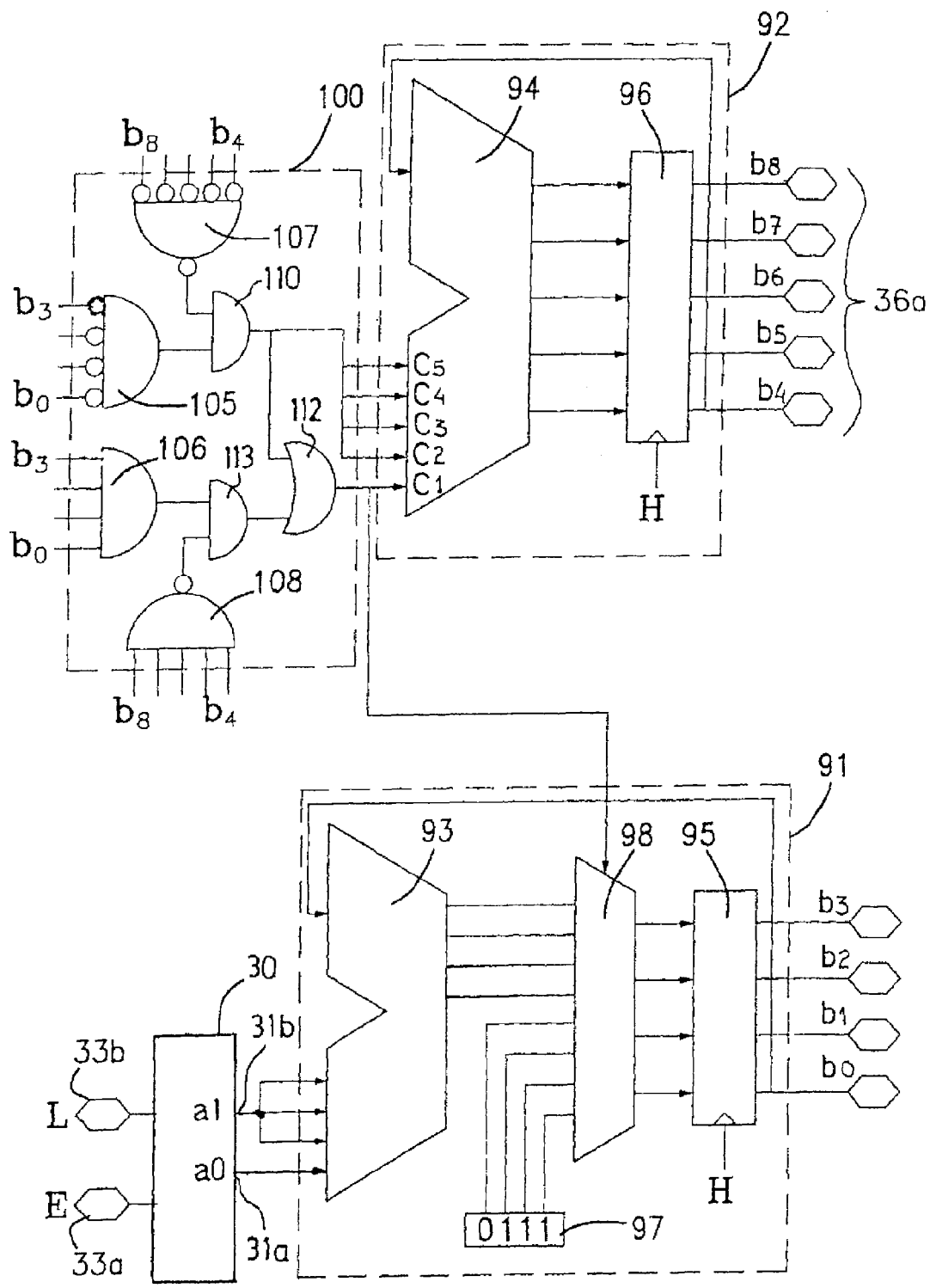
FIG. 9 is a diagram illustrating a third embodiment of a counting circuit of a device according to the invention.

The third embodiment represented FIG. 9 differs from the first embodiment by virtue of the fact that the adder circuit 35 is replaced by two adder stages 91, 92, a first, low-level adder stage 91 of which providing at its output low-weight bits, namely 4 low-weight bits b0, b1, b2, b3 in the example represented, of the counting/down-counting signal, and a second, high-level adder stage 92 providing at its output high-weight bits, namely 5 high-weight bits b4, b5, b6, b7, b8 in the example represented, of the counting/down-counting signal.

The first adder stage 91 includes an adder circuit 93 including two parallel digital 4-bit inputs providing the sum of the two inputs at a digital 4-bit output. The first input of this adder circuit 93 is fed from the phase-state signal E, L by the outputs 33a, 33b of the lead/lag detector 26 via the decision-making converter 30. The output 31b of the decision-making converter 30 supplying the filtered phase-state signal a1 is connected to three inputs of adder 93. If E=1, the decision-making converter 30 supplies the signal 0001 (corresponding to the relative value +1) to the input of adder circuit 93. If L=1, the decision-making converter 30 supplies the signal 1111 (corresponding the relative value −1) to the input of adder circuit 93. The output of adder circuit 93 is connected to the input of a multiplexer 98 which also receives at its input a value recorded in a 4-bit register 97. This value is preferably a median value—that is to say, a value starting from which it is necessary to count an identical number of variations (not necessarily immediately successive) in one direction or the other in order to trigger a modification of the value of the control input of the oscillator 19—that is to say, of the signal at the output of the second adder stage 92. In the example represented, register 97 contains the value 0111, so that the control signal will be modified only starting from the detection of an unbalance of 7 or 8 states in the same direction (or another number, according to the value contained in register 97).

The output of the multiplexer 98 is an output on 4 parallel bits supplied to a register 95 clocked by the reception clock signal H. This register 95 provides the low-weight output bits b0, b1, b2, b3 which are supplied to the second input of adder circuit 93 by means of a loop-back.

The second adder stage 92 includes an adder circuit 94 on 5 bits which is fed by a carry-over calculation circuit 100 detecting the extreme values (lower than zero and greater) of the low-weight output b0, b1, b2, b3. This carry-over calculation circuit 100 makes it possible to feed a 5-bit input of adder circuit 94 with a parallel digital signal constituting 5 high-weight bits in relation to the low-weight output b0, b1, b2, b3 of the first adder stage 91. In order to do this, the low-weight output signal b0, b1, b2, b3 is supplied to the input of two gates 105, 106 of the carry-over calculation circuit 100. The output of the AND gate 105 is equal to 1 when all the bits b0, b1, b2, b3 are equal to 0; it is equal to 0 when at least one of bits b0, b1, b2, b3 is equal to 1. The output of gate 105 is connected to the input of an AND gate 110, the output of which is applied to four high-weight bits c2, c3, c4, c5 of one of the two inputs of adder circuit 94 of the second stage 92. The output of gate 106 is equal to 1 when all the bits b0, b1, b2, b3 are equal to 1; it is equal to 0 when at least one of bits b0, b1, b2, b3 is equal to 0. The output of gate 106 is connected to the input of an AND gate 113, the output of which is connected to the input of an OR gate 112, the output of said OR gate forming the low-weight bit c1 of the same input of adder circuit 94 of the second stage 92. Furthermore, the output of gate 110 is connected to the second input of the OR gate 112.

When bits b0, b1, b2, b3 are all equal to 0, the output of gate 105 is equal to 1, and, if gate 110 allows, the same applies to the high-weight bits c2, c3, c4, c5 of the input of adder circuit 94, as well as one of the inputs of gate 112. Therefore the output of gate 112 is equal to 1, and the same applies to the low-weight bit c1 of the input of adder circuit 94. Consequently, in this situation the input c1, c2, c3, c4, c5 of adder circuit 94 of the second stage is equal to 11111, corresponding to the relative value −1 controlling a decrementation of a unit of register 96.

Likewise, when bits b0, b1, b2, b3 are all equal to 1 the output of gate 106 is equal to 1, and, if gate 113 allows, the same applies to the low-weight bit c1 of the input of adder circuit 94. Simultaneously, the output of gate 105 is equal to 0, and the same applies to the high-weight bits c2, c3, c4, c5 of the input of adder circuit 94. Consequently, in this situation the input c1, c2, c3, c4, c5 of adder circuit 94 of the second stage is equal to 00001, corresponding to the relative value +1 controlling an incrementation of a unit of register 96.

So long as one of the bits b0, b1, b2, b3 is equal to 0 and one of bits b0, b1, b2, b3 is equal to 1—that is to say, when the low-weight output of the first adder stage 91 has a value that does not correspond to one of the extreme values, the outputs of the two gates 105, 106 are both equal to zero, so that the input c1, c2, c3, c4, c5 of adder circuit 94 of the second stage is equal to 00000, so that the value of register 96 is not modified.

In this way, as soon as an extreme value of the low-weight output signal b0, b1, b2, b3 is attained, on the one hand the content of register 96 is incremented or decremented, because gates 105 or 106 permit the relative value +1 or −1 upstream of the input c1, c2, c3, c4, c5 of adder 94 to be propagated, and, on the other hand, the low-weight bit c1 of the input of adder circuit 94 being equal to 1, this value +1 or −1 activates the control signal of the multiplexer 98 which forces the reloading of register 95 with the value contained in register 97.

In this way, it is guaranteed that it is necessary for a phase shift of 7 or 8 states to occur in the same direction starting from the median value recorded in register 97 so that the control signal supplied to output 36a is effectively modified.

Adder circuit 94 exhibits an output on 5 bits b4, b5, b6, b7, b8 stored in a register 96 clocked with the reception clock signal H, the output of this register constituting the output 36a feeding the control input of the digital oscillator 19.

The output of register 96 is likewise provided at the second input of adder circuit 94 by means of a loop-back. Furthermore, the carry-over calculation circuit 100 also makes it possible, if the dynamics of the system require it, to avoid the untimely variations of the signal at the high-weight output 36a when the value of this signal attains an extreme value. In order to do this, the carry-over calculation circuit 100 includes two gates 107, 108 receiving the values of the high-weight bits b4, b5, b6, b7, b8 of output 36a, and the carry-over calculation circuit 100 is adapted to prohibit the incrementation of a unit when the signal on bits b4, b5, b6, b7, b8 is equal to 11111, and the decrementation of a unit when the signal on bits b4, b5, b6, b7, b8 is equal to 00000. This function is obtained by the gates 110, 113, which receive at their input the outputs of gates 107, 108, respectively. When bits b4, b5, b6, b7, b8 take the maximum value 11111, the output of gate 108 is equal to 0, so that the output of gate 113 is forced to zero; the output of 105 being furthermore equal to 0, the input c1, c2, c3, c4, c5 of adder circuit 94 remains equal to 0, prohibiting the incrementation of a unit of register 96. Likewise, when bits b4, b5, b6, b7, b8 take the minimum value 00000 the output of gate 107 is equal to 0, so that the output of gate 110 is forced to 0, as are the high-weight bits c2, c3, c4, c5 of the input of adder circuit 94, the input c1 of the adder circuit being furthermore equal to 0, prohibiting the decrementation of a unit of register 96.

Figure 10:
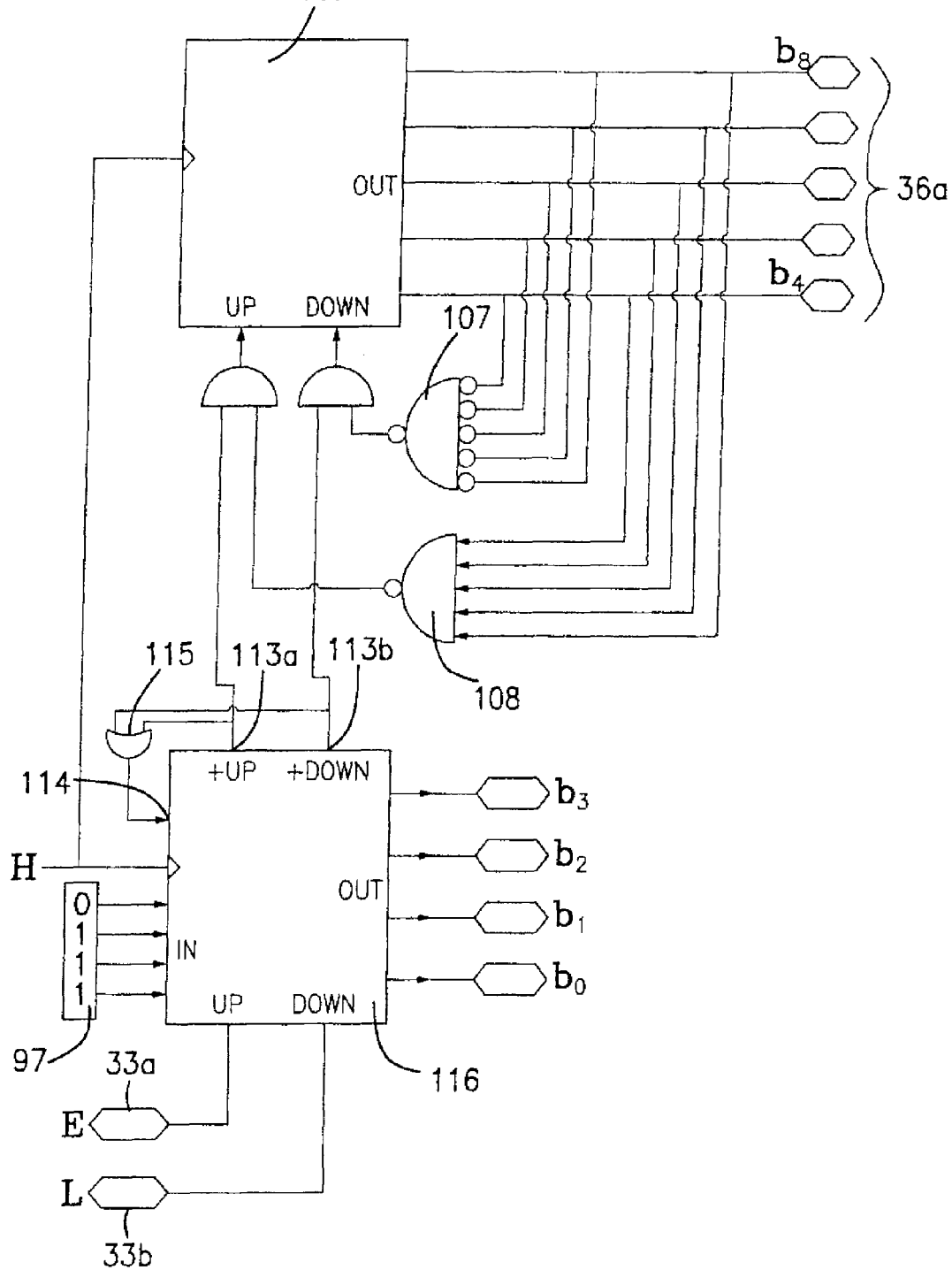
FIG. 10 is a diagram illustrating a fourth embodiment of a counting circuit of a device according to the invention.

FIG. 10 represents a fourth embodiment which is functionally similar to that shown in FIG. 9 but which is implemented by replacing the adders 93, 94 with counters/down-counters 116, 117. The first counter 116 receives the phase-state signals E and L at its counting and down-counting inputs, respectively. It exhibits a O-bit input IN receiving the median value recorded in register 97. Its output OUT provides the low-weight output signal b0, b1, b2, b3. It also exhibits upper and lower carry-over outputs 113a and 113b, respectively, as well as a control input 114 for reloading of its input IN. The upper carry-over output 113a is active when the counting input is incremented by a unit and the output OUT is at its maximum value 1111. Likewise, the lower carry-over output 113b is active when the down-counting input is incremented by a unit and the output OUT is at its minimum value 0000.

The upper and lower carry-over outputs 113a and 113b feed the counting and down-counting inputs, respectively, of the second counter/down-counter 117. Moreover, a gate 115 detects an active state of these two, upper and lower, carry-over outputs 113a and 113b and imposes a reloading of the input IN of the first counter 116 when one of these upper and lower carry-over outputs 113a and 113b is active. In this way, the first counter 116 is re-initialised to the median value contained in register 97 as soon as the low-weight output b0, b1, b2, b3 has exceeded one of its extreme values. Here too, it is therefore ensured that it is necessary to ascertain a phase shift for at least 8 or 9 (or another number, according to the value contained in register 97) successive states starting from one of the extreme values of the low-weight output b0, b1, b2, b3 in order to modify the value of the high-weight output 36a.

The second counter/down-counter 117 exhibits an output on 5 parallel bits constituting the high-weight output 36a feeding the control input of the oscillator 19. As in the previous embodiment, gates 107, 108 are provided receiving the values of the high-weight bits b4, b5, b6, b7, b8 of output 36a and adapted to prohibit the incrementation of a unit when the signal on bits b4, b5, b6, b7, b8 is equal to 11111, and the decrementation of a unit when the signal on bits b4, b5, b6, b7, b8 is equal to 00000.

In a device according to the invention the injection-locked oscillator is adapted so that an increment of the digital control signal brings about a modification of the natural frequency of the oscillator in accordance with a predetermined value step Δf. The choice of the number of bits retained in order to form the bus of the control signal from the parallel output of the accumulator circuit, and the choice of the adjustment step Δf, depend on the dynamics required for the phase-locked loop 25. For example, for an natural frequency of the injection-locked oscillator 19 of the order of 10 GHz, with a step Δf smaller than 1%, and in particular of the order of 0.3%, each increment of a unit of the digital control signal brings about a variation of this natural frequency of the order of 30 MHz. Furthermore, in the same example, if the control signal of the oscillator 19 comprises, as in the examples described, 5 bits, this signal makes it possible to implement thirty-two increments and therefore provides a range of adjustment of the natural frequency fos of the injection-locked oscillator 19 of the order of 10%—that is to say, of the order of 1 GHz.

EXAMPLE

A prototype of a device according to the first embodiment of the invention was produced in the form of an ASIC circuit using 0.13 μm CMOS technology from STMicroelectronics. This prototype, encapsulated in a housing, was transferred to a glass-Teflon printed circuit, which made it possible to validate the entire operation of this architecture which successfully passed a complete electrical characterisation.

The invention may be the object of very numerous embodiment variants in relation to the exemplary embodiments represented in the Figures and described above. In particular, the various components of the device (lead/lag detector, decision-making converter, counting circuit, oscillator, pulse-generator etc.) may be implemented by other circuit structures known as such and providing the same functions. For example, circuits 100, 107, 108 may be the object of implementations (with other types of logic gates or other combinations of logic gates) other than those given by way of example and having the same technical functions.

The invention claimed is:

1. A device for clock extraction, said device comprising:
a reception clock signal circuit having
i) a reception input (10) for receiving a baseband serial signal representative of digital data and coded with a clock signal exhibiting a clock-bit frequency fsr, the reception clock signal circuit being clocked at the clock-bit frequency fsr, and
ii) a digitally controlled injection-locked oscillator (19) coupled to the reception input (10) with a digital command input for receiving a digital control signal, a value of a natural frequency fos of the injection-locked oscillator (19) depending on a value of the digital control signal received at the digital command input, and a clock output (29) supplying a reception clock signal, the reception clock signal being at least substantially synchronised and in phase with the clock-bit frequency fsr of the received baseband serial signal;
a phase-control loop having
i) a first input (27) connected to the clock output (29) of the reception clock signal circuit,
ii) a second input (28) fed by a signal resulting from the received baseband serial signal,
iii) a digital phase detector including a lead/lag detector (26), the phase detector comprising an input connected to the first and second inputs, and an output supplying digital phase-state signals (33a, 33b) representative i) of a phase shift between the reception clock signal and the received baseband serial signal, and ii) of a shift direction between the reception clock signal and the received baseband serial signal, and
iv) a counting circuit having i) a filtering circuit (30, 35) with a counting input (32a, 32b) connected to said output of the digital phase detector and ii) an output (36) supplying the digital control signal (36a) connected to the command input of the injection-locked oscillator (19), the control signal setting a value of a frequency of the reception clock signal,
said filter circuit (30, 35) i) implementing filtering by digital counting/down-counting in response to variations of relative values of the digital phase-state signals supplied in time by the output of the phase detector, and ii) supplying the digital control signal, the digital control signal having a value which is a function of the filtering, the value of the digital control signal setting the value of the frequency of the reception clock signal equal to a value of the clock-bit frequency fsr of the reception clock signal, wherein,
the digital control signal is a filtered phase-state signal having
i) a first relative value after a first case of reception of a predetermined number N of successive identical values at the counting input (32a, 32b) corresponding to N successive data bits from the lead/lag detector indicating a phase shift in a same first direction, N being greater than 1, ii) a second relative value after a second case of reception of N successive identical values at the counting input corresponding to N successive data bits from the lead/lag detector indicating a phase shift in a second direction, and iii) a third relative value in cases other than the first and second cases, the first, second, and third relative values of the filtered phase-state signal representing a presence of a phase shift in the same direction and the direction of the phase shift, for N successive data bits of the received baseband serial signal, between edges of the reception clock signal and corresponding data bits of the received baseband serial signal.

2. The device as claimed in claim 1, wherein the lead/lag detector supplies, at a first output, a digital phase state signal (33a) of said digital phase state signals (33a, 33b) representative of a phase lead between the reception clock signal and the received signal, and at a second output, a digital phase state signal (33b) of said digital phase state signals (33a, 33b) representative of a phase lag between the reception clock signal and the received signal.

3. The device as claimed in claim 1, wherein the lead/lag detector samples the received baseband serial signal at rising and falling edges of the reception clock signal.

4. The device as claimed in claim 1, wherein the lead/lag detector implements double sampling comprised of i) one sample in phase with edges of the reception clock signal, and ii) another sample in quadrature with the edges of the reception clock signal, the double sampling determining an intermediate state of the received signal.

5. The device as claimed in claim 1, wherein said counting circuit comprises a decision-making converter.

6. The device as claimed in claim 1, wherein said counting circuit includes an accumulator circuit including at least one input receiving a digital signal resulting from each phase-state signal supplied by the lead/lag detector, the accumulator circuit supplying a digital counting/down-counting signal with a relative value representative of a reception of a plurality of relative values exhibited at the inputs of the accumulator circuit.

7. The device as claimed in claim 4, wherein said counting circuit includes successively a decision-making converter and an accumulator circuit to aggregate the relative values of the filtered phase-state signal supplied by the decision-making converter.

8. The device as claimed in claim 7, wherein, the accumulator circuit comprises a parallel output supplying a parallel digital counting/down-counting signal, and the digital command input of the injection-locked oscillator includes a parallel digital control input including a number of bits lower than bits of the parallel digital output of the accumulator circuit, only a portion of high-weight bits of the parallel digital output of the accumulator circuit being linked to the bits of the parallel digital control input of the injection-locked oscillator so that said control signal supplied by the counting circuit is formed from said portion of the high-weight bits of said counting/down-counting signal.

9. The device as claimed in claim 8, wherein the parallel digital control input of the injection-locked oscillator comprises 5 bits, only 5 high-weight bits of the parallel digital output of the accumulator circuit being linked to the 5 bits of the parallel digital control input of the injection-locked oscillator.

10. The device as claimed in claim 7, wherein the digital command input of the injection-locked oscillator is connected to a switch circuit including a plurality of switches, each switch being connected in series to at least one condenser integrated into the injection-locked oscillator, operation of the switches modifying the natural frequency of the injection-locked oscillator.

11. The device as claimed in claim 10, wherein each bit of the digital control signal is linked to one of the switches.

12. The device as claimed in claim 1, further includes a synchronisation-pulse generator generating a signal of current pulses at the frequency of edges of the received signal and adapted for the operation of the injection-locked oscillator, the synchronisation-pulse generator supplying the current-pulse signal to a single output connected solely to a current input of the injection-locked oscillator.

13. The device as claimed in claim 1, further comprising:

a sampling circuit for sampling of the received baseband serial signal with the reception clock signal, the sampling circuit having a first signal input connected to the reception input, and a second clock input connected to the clock output of the injection-locked oscillator, the sampling circuit supplying to at least one data output digital data transmitted by received signal; and at least one phase-shifting circuit providing a constant phase difference between the signal input and the clock input of the sampling circuit, a total phase difference between the signal and clock inputs resulting from each phase-shifting circuit providing a phase alignment of the signal at the signal input and of the signal at the clock input.

14. The device as claimed in claim 13, wherein the sampling circuit is constituted by a flip-flop D.

15. The device as claimed in claim 1, said device being free from any external adjustment.

16. The device as claimed in claim 1, said device comprising a differential architecture.

17. The device as claimed in claim 1, said device comprising at least one integrated circuit incorporating at least the injection-locked oscillator.

18. The device as claimed in claim 1, said device functioning with said clock-bit frequency fsr higher than 500 MHz.

19. The device as claimed in claim 1, wherein the digital command input of the injection-locked oscillator is connected to a switch circuit including a plurality of switches, each switch being connected in series to at least one condenser integrated into the injection-locked oscillator, operation of the switches modifying the natural frequency of the injection-locked oscillator.

* * * * *